United States Patent [19]

Berlin et al.

[11] Patent Number: 5,252,858
[45] Date of Patent: Oct. 12, 1993

[54] REFRACTORY COVERCOAT FOR SEMICONDUCTOR DEVICES

[75] Inventors: Carl W. Berlin, Bringhurst; John K. Isenberg, Rossville, both of Ind.

[73] Assignee: Delco Electronics Corporation, Kokomo, Ind.

[21] Appl. No.: 793,896

[22] Filed: Nov. 18, 1991

[51] Int. Cl.⁵ .................... H01L 23/28; H01L 23/29
[52] U.S. Cl. ................................. 257/702; 257/788; 257/789; 257/794; 257/795; 361/748; 174/52.2
[58] Field of Search ............... 257/701, 702, 787, 788, 257/789, 790, 794, 795; 361/397; 174/52.2

[56] References Cited

U.S. PATENT DOCUMENTS

| | | | |
|---|---|---|---|
| 4,510,519 | 4/1985 | Dubois et al. | 257/796 |
| 4,577,056 | 3/1986 | Butt | 257/709 |
| 4,583,283 | 4/1986 | Dubois et al. | 257/713 |

*Primary Examiner*—Rolf Hille
*Assistant Examiner*—David Ostrowski
*Attorney, Agent, or Firm*—Cary W. Brooks

[57] ABSTRACT

Disclosed is a refractory covercoat composition useful in making two-sided circuitries. The refractory composition contains glass frit, and an inorganic binder including at least one selected from the group consisting of $ZrO_2$, $Al_2O_3$, $SiO_2$, $BaO$, $CaO$, $MgO$ and $La_2O_3$. The refractory covercoat has an elevated softening point so that the covercoat protects a printed conductor circuit from damage due to contact with a firing furnace conveyor belt.

2 Claims, No Drawings

REFRACTORY COVERCOAT FOR SEMICONDUCTOR DEVICES

This invention relates to a covercoat for semiconductor devices, and more particularly to a covercoat for use in a refiring process of two-sided thick film circuits to protect the underside conductor runners that come in contact with a furnace belt.

BACKGROUND

Thick film covercoat materials are generally used to electrically, mechanically and hermetically insulate a thick film circuit. A wide variety of materials exist at various costs for different applications. Inexpensive glass covercoats are often employed for their hermeticity properties usually to improve resistor stability. Organic covercoats provide some electrical insulation and often are used for mechanical protection of the circuit during low temperature processing. Dielectric materials are used for the electrical insulating properties.

However, during the refiring process of two-sided thick film circuits, damage may occur to the underside conductor runners that come into contact with a furnace belt. Common glass covercoats flow and stick to the belt upon refiring. Organic covercoats cannot withstand the high temperatures of the refiring process. Dielectric materials often discolor in the areas closest to the belt mesh and are expensive to use. The problem of preventing damage to the conductive runners on the underside of a two-sided thick film circuit may be solved by propping up the substrate so that the circuitry does not touch the belt during the refiring process. However, this is time consuming and usually is done manually. The problem may also be solved by modifying the belt furnace. However, this is very expensive and may result in limiting the flexibility of the furnace to run various products.

In order to form a two-sided thick film circuitry semiconductor device, a conductive runner composition is printed on the top face of the substrate. The substrate is then fired in a furnace to cure the printed conductor runners. A covercoat is then applied to the top face circuitry and fired. The substrate then may be flipped over and the process repeated for the bottom face. However, upon the refiring process of the two-sided thick film circuits, damage may occur to the underside conductive runners that come into contact with the furnace belt if the overcoat is not capable of withstanding high temperatures.

Thus, there is a need for a thick film covercoat which mechanically protects a two-sided thick film circuitry substrate and which is capable of withstanding the high temperatures of the refiring process.

SUMMARY OF THE INVENTION

The invention includes a thick film covercoat composition including a glass component with a relatively low softening point so that upon firing it will wet and seal an underlying circuitry on a substrate from its surrounding environment, and an inorganic filler that upon firing will partially or completely dissolve into the glass so as to raise its softening point to a level such that upon refiring of the glass/filler mixture it will not become tacky or sticky to the touch. The glass component may include at least one material selected from the group consisting of Cao, $Al_2O_3$, PbO, $B_2O_3$, and $SiO_2$. The inorganic filler may include at least one material selected from the group consisting of $ZrO_2$, $Al_2O_3$, $SiO_2$, BaO, CaO, MgO and $La_2O_3$. The weight ratio of the glass component to the inorganic filler may range from about 60/40 to about 70/30. The glass component and inorganic filler together may make up about 65 to about 75 weight percent of the composition. The composition may also include organic binder in an amount ranging from about 25 to about 35 weight percent of the composition. The invention includes the composition and methods of making and using the same.

These and other features, objects and advantages will become apparent from the following detailed description and appended claims.

DETAILED DESCRIPTION

The present invention includes a refractory covercoat for mechanically protecting a two-sided circuitry substrate and which will withstand the high temperature refiring process of a second side of the circuitry without becoming tacky or sticky to the touch. The composition includes a glass component, an inorganic filler component, and may include an organic binder and a colorant.

The glass component may be glass frit. The glass component may include at least one selected from the group consisting of CaO, $Al_2O_3$, PbO, $B_2O_3$, and $SiO_2$. A suitable glass component is available from Ferro Corporation in Cleveland, Ohio, under the trade name EG-2778. The glass component may have a particle size ranging from about 1 to about 10 microns and may have a surface area of about $2.7 \pm 0.3$ meters square per gram.

The inorganic filler may include at least one material selected from the group consisting of $ZrO_2$, $Al_2O_3$, $SiO_2$, BaO, CaO, MgO and $La_2O_3$. Preferably, the inorganic filler comprises $Al_2O_3$. The inorganic filler may have a particle size ranging from about 1 micron to about 5 microns, preferably about 1 to about 3, and most preferably about 2.5 microns.

It has been discovered that an inorganic filler having such a particle size will dissolve quickly during the refiring process so as to raise the temperature of the softening point of the glass layer so that it does not become tacky or sticky when fired against a furnace belt.

The ratio of glass component to inorganic filler may range from about 70/30 to about 60/40. The glass component and the inorganic filler together may comprise from about 65 to about 75 weight percent of the composition. A suitable inorganic filler is available from Alcoa Corporation under the trade name A-1000SGD.

The composition may also include an organic binder which may be present in an amount ranging from about 25 to about 35 weight percent of the total composition. The organic binder operates to provide a median for screen printing the inorganic components of the thick film and is removed from the position during firing. A suitable organic binder may be prepared from the following composition:

| | |
|---|---|
| 45.6% | DuPont Thinner 9506 |
| 45.6% | DuPont Thinner 8250 |
| 5.0% | Igepal |
| 3.8% | Ethyl Cellulose N-200 |

It has been found that this organic binder limits the pinholes often associated with screen printing.

The composition may also include a colorant which may be present in an amount of about 1.5%. A suitable colorant is available from Hommel Corporation under the trade name BG-210D.

The glass component, inorganic filler, organic binder and colorant may be mixed together in a three-roll mill at low or no pressure and so as to minimize contamination caused by grinding of the mill rolls. A refractory covercoat composition so prepared may be utilized as follows. A conductive ink may be printed on a top surface of a substrate to define a circuitry in a manner known in the art. The wet printed conductors may be fired in an oven to produce cohesive electrically conductive runners in a manner known in the art. The refractory covercoat composition of the present invention may be applied onto to the top surface of the substrate covering the first circuitry in a manner known in the art. The thickness of the covercoat may range from about 15 to about 40 microns. The refractory covercoat composition may be fired in an oven in a manner known in the art.

The substrate may then be flipped over and a second printing of conductive ink may be made on the back face of the substrate. The top face of the substrate may then be placed on a conveyor belt of a furnace and fired to consolidate the second printing of conductive ink at a temperature of about 850° C. peak for about 10 minutes over a 1 hour profile. It is preferred the first firing be at a temperature equal to or greater than that of the second firing. The thickness of the fired covercoat may range from about 10 to about 30 microns. The refractory covercoat will not become sticky or tacky during the refiring, and will protect the circuitry on the top face of the substrate from being damaged by the furnace conveyor belt.

When some aspect of the invention is defined herein in terms of ranges or proportions, such is intended to convey the invention as including the entire range and any sub-range or multiple sub-range within the broad range. For example, when the invention is defined as including 5-95 weight percent component A, such is intended to convey the invention as including 5-25 weight percent A, 75-95 weight percent A, and 20-80 weight percent A.

The embodiments of the invention in which an exclusive property or privilege is claimed are defined as follows:

1. A semiconductor device comprising a substrate having first and second faces; a printed and fired circuit on each of said faces, a fired refractory covercoat on each of said faces and said printed and fired circuit; and wherein said refractory covercoat is formed from firing a composition comprising a glass frit, a filler material comprising at least one selected from the group consisting of $ZrO_2$, $Al_2O_3$, $SiO_2$, $BaO$, $CaO$, $MgO$ and $La_2O_3$, and an organic binder wherein said glass frit and filler material are present in a weight ratio ranging from 60/40 to 70/30 respectively in said composition, said organic binder is present in 25 to 35 weight percent of the composition and said filler having a particle size of about 1 to 3 microns.

2. A semiconductor device as set forth in claim 1 wherein said filler material consists essentially of $Al_2O_3$.

* * * * *